(12) United States Patent
Dong et al.

(10) Patent No.: US 9,795,066 B2
(45) Date of Patent: Oct. 17, 2017

(54) INVERTER

(71) Applicant: Sungrow Power Supply Co., Ltd., Hefei, Anhui (CN)

(72) Inventors: Puyun Dong, Anhui (CN); Yonghong Li, Anhui (CN); Hao Zhou, Anhui (CN); Jianhua Mao, Anhui (CN)

(73) Assignee: SUNGROW POWER SUPPLY CO., LTD., Hefei (CN)

( * ) Notice: Subject to any disclaimer, the term of this patent is extended or adjusted under 35 U.S.C. 154(b) by 0 days.

(21) Appl. No.: 15/050,574

(22) Filed: Feb. 23, 2016

(65) Prior Publication Data

US 2016/0366794 A1  Dec. 15, 2016

(30) Foreign Application Priority Data

Jun. 15, 2015  (CN) .................... 2015 2 0412624 U

(51) Int. Cl.
*H05K 7/20* (2006.01)
*H02M 7/00* (2006.01)

(52) U.S. Cl.
CPC ........ *H05K 7/20909* (2013.01); *H02M 7/003* (2013.01)

(58) Field of Classification Search
CPC ........... H05K 7/20909; H05K 7/20145; H05K 1/0233; H05K 9/0007; H01G 9/08; G06F 1/1656; G06F 1/20
See application file for complete search history.

(56) References Cited

U.S. PATENT DOCUMENTS

| | | | | |
|---|---|---|---|---|
| 4,772,999 A | * | 9/1988 | Fiorina | H02J 9/062 361/709 |
| 5,091,823 A | * | 2/1992 | Kanbara | H02M 5/44 174/351 |
| 5,497,289 A | * | 3/1996 | Sugishima | H02M 7/003 318/558 |

(Continued)

FOREIGN PATENT DOCUMENTS

| DE | WO 2014114622 A3 * | 10/2014 | ......... H05K 7/20918 |
|---|---|---|---|
| GB | 2385469 | 8/2003 | |

OTHER PUBLICATIONS

Donth et al., Inverter having two-part housing, Oct. 9, 2014, WO 2014/114622 Espacenet Translation.*

(Continued)

*Primary Examiner* — James Wu
*Assistant Examiner* — Michael Matey
(74) *Attorney, Agent, or Firm* — Conley Rose, P.C.

(57) ABSTRACT

An inverter is provided. In the inverter, an electronic device is disposed inside a first enclosure; a heat radiator and a cooling fan are disposed inside a second enclosure; a magnetic element is disposed outside the first enclosure and the second enclosure. In this way, the cooling effect on the electronic device inside the first enclosure and the heat radiator inside the second enclosure are increased as they may be less affected by the heat generated by the magnetic element. It is also beneficial to heat dissipation of the magnetic element. The cooling fan blows the heat radiator for heat dissipation; the magnetic element does not block the relatively cold air flowing through the heat radiator. Therefore, a less obstructed air duct is formed, and the dissipation effect is improved.

6 Claims, 2 Drawing Sheets

(56) References Cited

U.S. PATENT DOCUMENTS

| | | | | |
|---|---|---|---|---|
| 7,729,115 B2* | 6/2010 | Hall | ................... | H05K 7/20918 |
| | | | | 165/183 |
| 8,767,401 B2* | 7/2014 | Kim | ................... | H05K 7/20909 |
| | | | | 361/697 |
| 2009/0231815 A1* | 9/2009 | Kim | ................... | H05K 7/20409 |
| | | | | 361/714 |
| 2010/0079944 A1* | 4/2010 | Loth | ................... | H05K 7/20918 |
| | | | | 361/695 |
| 2010/0302728 A1* | 12/2010 | Knaup | ............... | H05K 7/20918 |
| | | | | 361/690 |
| 2011/0222244 A1* | 9/2011 | Takashiro | ............. | H02M 7/003 |
| | | | | 361/704 |
| 2011/0279970 A1* | 11/2011 | Guan | ........................ | G06F 1/20 |
| | | | | 361/679.47 |
| 2012/0002452 A1 | 1/2012 | Hetzroni | | |
| 2012/0063089 A1* | 3/2012 | Kishimoto | ......... | H05K 7/20909 |
| | | | | 361/697 |
| 2013/0343110 A1* | 12/2013 | Liu | .................... | H05K 7/20909 |
| | | | | 363/141 |
| 2014/0321065 A1 | 10/2014 | Nishimura | | |
| 2014/0374395 A1* | 12/2014 | Dunahoo | ............. | B23K 9/1006 |
| | | | | 219/130.1 |
| 2015/0342087 A1* | 11/2015 | Donth | ................ | H05K 7/20918 |
| | | | | 361/695 |

OTHER PUBLICATIONS

Extended European Search Report dated Mar. 27, 2017, for European Application No. 16157092.4-1809 (\7 p.).

* cited by examiner

INVERTER

CROSS REFERENCE TO RELATED APPLICATIONS

The present application claims priority to Chinese Patent Application No. 201520412624.4, titled "INVERTER", filed on Jun. 15, 2015 with the State Intellectual Property Office of the PRC, the disclosure of which being incorporated herein by reference in its entirety.

FIELD

The present disclosure relates to the technical field of power electronic technology, and in particular to an inverter.

BACKGROUND

A conventional inverter typically includes an electronic device, a magnetic element, a heat radiator and an enclosure. There are two common configurations for the conventional inverter.

In one configuration, the electronic device and the magnetic element are disposed in an enclosure, and the heat radiator is disposed outside the enclosure. In this configuration, most of the heat generated by the magnetic element accumulates inside the enclosure when the inverter operates. The relatively high heat content acts on the electronic device inside the enclosure, which may damage the electronic device.

In another configuration, the electronic device is disposed inside an enclosure, while the magnetic element and the heat radiator are disposed in parallel. In addition, a fan is provided to blow air onto the magnetic element and the heat radiator for heat exchange. The relatively cold air flows through the heat radiator and then passes across the magnetic element. In this configuration, the magnetic element may block the relatively cold air from flowing through the heat radiator, thus reducing the heat dissipation of the heat radiator.

Hence, the effectiveness of heat dissipation of the two common configurations for conventional inverters is reduced.

SUMMARY

In view of this, an inverter is provided according to the disclosure, to address the problem of poor heat dissipation in the conventional technology.

An inverter is provided, which includes an electronic device, a magnetic element, a heat radiator, a cooling fan, a first enclosure and a second enclosure connected with each other via a mounting plate, where
  the mounting plate is located between the first enclosure and the second enclosure;
  the electronic device is disposed inside the first enclosure;
  the heat radiator and the cooling fan are disposed inside the second enclosure; and
  the magnetic element is disposed outside the first enclosure and the second enclosure.

In an embodiment, the first enclosure and the second enclosure may share one mounting plate, and may be located on two parallel mounting surfaces of the mounting plate respectively.

In an embodiment, the heat radiator may be disposed on the mounting plate inside the second enclosure; and the electronic device may be disposed on the mounting plate inside the first enclosure.

In an embodiment, the magnetic element may be disposed on a top plate of the second enclosure.

In an embodiment, the cooling fan may be disposed on a side plate of the second enclosure inside the second enclosure; the side plate may be perpendicular to gaps between fins of the heat radiator.

In an embodiment, one or more vents may be disposed in another side plate of the second enclosure, the another side plate may be perpendicular to the gaps between the fins of the heat radiator.

In an embodiment, the number of vents may be more than one, and the vents may be uniformly disposed at positions corresponding to the gaps between the fins of the heat radiator.

In an embodiment, the number of the cooling fans may be four.

In embodiments of the inverter of the present disclosure, the electronic device is disposed inside the first enclosure; the heat radiator and the cooling fan are disposed inside the second enclosure; and the magnetic element is disposed outside the first enclosure and the second enclosure. In this way, the cooling effect on the electronic device inside the first enclosure and the heat radiator inside the second enclosure may be less affected by the heat generated by the magnetic element. Disposing the magnetic element outside the first enclosure and the second enclosure is also beneficial to the heat radiation of the magnetic element. Unlike in the conventional technology, the cooling fan blows air over the heat radiator for heat radiation, thus, the magnetic element does not block the relatively cold air flowing through the heat radiator. Therefore, a more unobstructed air duct is formed, and the radiation effect is improved.

BRIEF DESCRIPTION OF THE DRAWINGS

The appended drawings in the description of the exemplary embodiments are described briefly as follows. The appended drawings are used only to illustrate some exemplary embodiments of the present disclosure. For those skilled in the art, other drawings may be obtained according to the disclosure that is provided herein without any inventive work.

DETAILED DESCRIPTION OF THE DISCLOSED EXEMPLARY EMBODIMENTS

The exemplary embodiments of the present disclosure are described clearly and completely as follows in conjunction with the accompanying drawings. The described embodiments are only a few rather than all of the embodiments according to the present disclosure. Other embodiments may be obtained by those skilled in the art without any inventive work based on the detailed description of the exemplary embodiments presented herein.

An inverter is provided according to the present disclosure, to address the problem of poor heat dissipation in the conventional technology.

Figure 1:
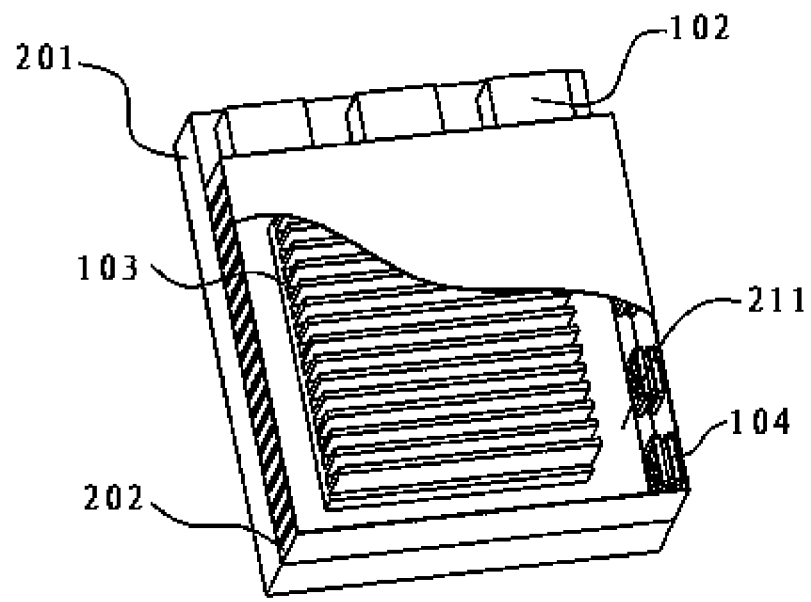
FIG. 1 is a schematic structural diagram of an inverter according to an embodiment of the present disclosure.
Figure 2:
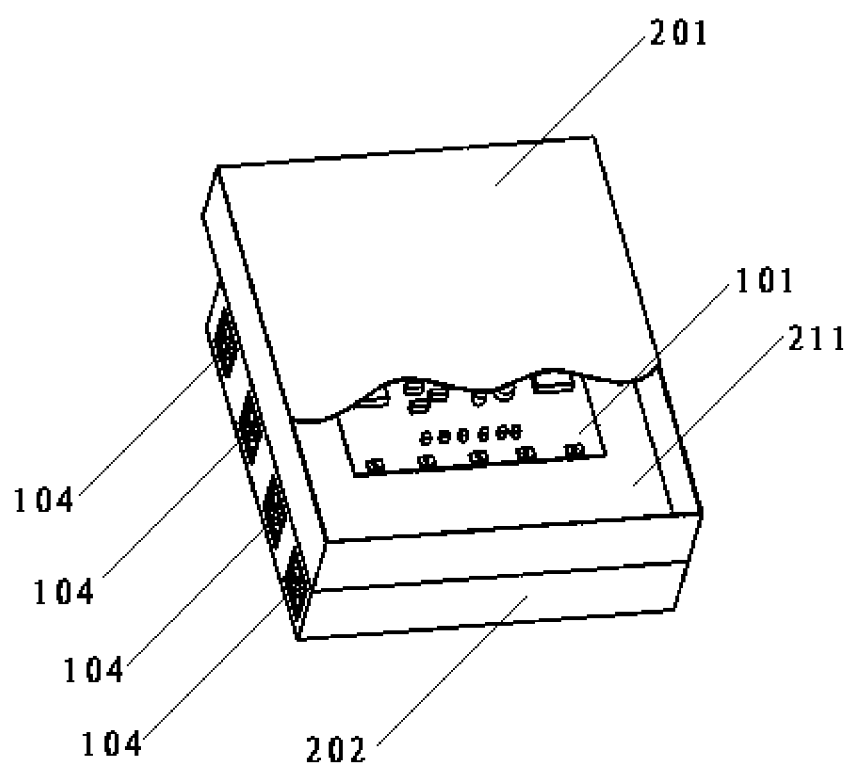
FIG. 2 is a schematic structural diagram of an inverter according to an embodiment of the present disclosure.

As shown in FIG. 1 and FIG. 2, the inverter includes: an electronic device 101, a magnetic element 102, a heat radiator 103, a cooling fan 104, a first enclosure 201 and a second enclosure 202 connected with each other via a mounting plate 211. The mounting plate 211 is located between the first enclosure 201 and the second enclosure 202. The electronic device 101 is disposed inside the first enclosure 201. The heat radiator 103 and the cooling fan 104 are disposed inside the second enclosure 202, and the magnetic element 102 is disposed outside the first enclosure 201 and the second enclosure 202.

The magnetic element 102 is disposed outside the first enclosure 201 and the second enclosure 202. This may result in a cooling effect on the electronic device 101 inside the first enclosure 201, and the heat radiator 103 inside the second enclosure 202 is less affected by the heat generated by the magnetic element 102. The magnetic element 102 is disposed outside the first enclosure 201 and the second enclosure 202, and is directly contacted with outside air. The heat generated by the magnetic element 102 is easily exchanged with the air, hence, the temperature of the magnetic element 102 is reduced. Thus, it is beneficial to the heat dissipation of the magnetic element 102, and the operational efficiency of the magnetic element 102 is improved. The cooling fan 104 only blows air on the heat radiator 103 for heat dissipation because the magnetic element does not block the relatively cold air flowing through the heat radiator as occurs in the conventional technology. Therefore, a less obstructed air duct is formed, and radiation dissipation is improved.

The magnetic element 102 being disposed outside the first enclosure 201 and the second enclosure 202 may result in a lower heat content for the electronic device 101 inside the first enclosure 201, and the heat radiator 103 inside the second enclosure 202 is less affected by the heat generated by the magnetic element.

In an embodiment, each of the first enclosure 201 and the second enclosure 202 may include the mounting plate 211 to mount a respective device.

In an embodiment, the first enclosure 201 and the second enclosure 202 share one mounting plate 211, and are located on two parallel mounting surfaces of the mounting plate 211 respectively.

The electronic device 101 and the heat radiator 103 are mounted on two parallel mounting surfaces of the mounting plate 211 respectively, and the two parallel mounting surfaces of the mounting plate 211 may be the two surfaces having the largest areas. In some embodiments, the two parallel mounting surfaces of the mounting plate 211 may be two surfaces, for mounting the devices, may not be the two surfaces having the largest areas, however they may be defined depending on the specific application.

The first enclosure 201 and the second enclosure 202 are respectively disposed on the two parallel mounting surfaces of the mounting plate 211 so that the first enclosure 201 and the second enclosure 202 are connected in a back-to-back way. Taking a cuboid as an example for description, both the first enclosure 201 and the second enclosure 202 have five surfaces, and are mounted on a front surface and a back surface of the mounting plate 211.

In some embodiments, the heat radiator 103 is disposed on the mounting plate 211 inside the second enclosure 202 (as shown in FIG. 1); and the electronic device 101 is disposed on the mounting plate 211 inside the first enclosure 201 (as shown in FIG. 2).

As shown in FIG. 1 and FIG. 2, the heat radiator 103 and the electronic device 101 are disposed at two sides of the mounting plate 211 respectively so that the heat radiator 103 and the electronic device 101 are contacted in a back-to-back way via the mounting plated 211. In this way, the heat radiator 103 may operate to dissipate heat for the electronic device 101.

Figure 3:
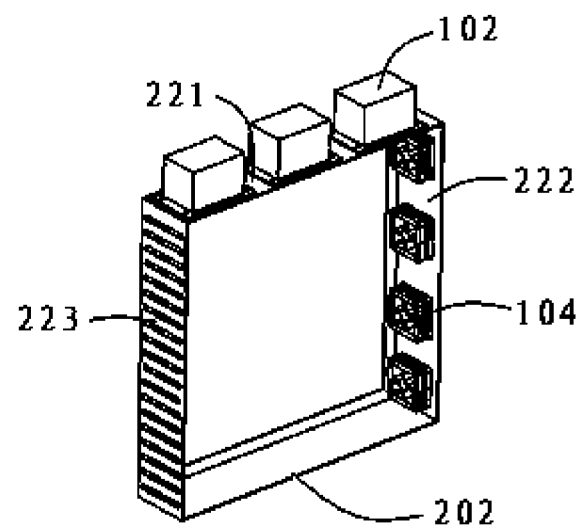
FIG. 3 is a schematic structural diagram of a second box according to an embodiment of the present disclosure.

In an embodiment, as shown in FIG. 3, the magnetic element 102 is disposed on a top plate 221 of the second enclosure 202.

The position where the magnetic element 102 is disposed is named as the top plate 221 of the second enclosure 202, and a direction in the description is referred to a placement direction of the inverter when the inverter operates.

The magnetic element 102 is disposed on the top plate 221 of the enclosure and is in direct contacted with outside air. Thus, the heat generated by the magnetic element 102 is easily exchanged with the air. Hence, the temperature of the magnetic element 102 is reduced. It is beneficial to dissipate the heat of the magnetic element 102 because the operational efficiency of the magnetic element 102 is improved.

In an embodiment, as shown in FIG. 1, the cooling fan 104 is disposed on a side plate 222 of the second enclosure 202 inside the second enclosure 202, the side plate 222 being perpendicular to gaps between fins of the heat radiator 103.

The cooling fan 104 may be disposed on the side plate 222 of the second enclosure 202 perpendicular to the gaps between the fins of the heat radiator 103. In this way, it is ensured that the relatively cold air flow generated by the cooling fan 104 may flow through the heat radiator 103 in a large area, which is beneficial to the heat dissipation of the heat radiator 103.

In an embodiment, as shown in FIG. 1, one or more vents are disposed in another side plate 223 of the second enclosure 202, the another side plate 223 is perpendicular to the gaps between the fins of the heat radiator 103.

In an embodiment, as shown in FIG. 1, the number of the vents is more than one, and the vents are uniformly disposed at positions corresponding to the gaps between the fins of the heat radiator 103.

The positions corresponding to the gaps between the fins of the heat radiator 103 correspond to projection of the gaps between the fins of the heat radiator 103 on the side plate 223.

The cooling fan 104 and the vents are disposed at two sides of the heat radiator 103 respectively, so that the cold air flow generated by the cooling fan 104 can pass through the gaps between the fins of the heat radiator 103 and the vents, thus creating an unobstructed air duct, which is beneficial to the heat dissipation of the heat radiator 103.

In an embodiment, the number and positions of the vents may depend on the specific application of the inverter, which is not limited herein.

In an embodiment, as shown in FIG. 2 and FIG. 3, the number of the cooling fans 104 is four.

In an embodiment, the number of the cooling fans 104 is not limited. The cooling fans 104 shown in the drawings show only an example, and the number of cooling fans 104 may depend on the specific application of the inverter.

In the discussion above, the embodiments are described in a progressive manner with the emphasis of each embodiment on an aspect difference from other embodiments. Hence, reference can be made to these similar parts among the embodiments.

The description of the embodiments herein enables those skilled in the art to implement or use the present disclosure. Numerous modifications to the exemplary embodiments are apparent to those skilled in the art, and the general principles defined herein can be implemented in other embodiments without deviating from the spirit or scope of the present disclosure. Therefore, the present disclosure may not be limited to the exemplary embodiments described herein, but in the specification should be interpreted in accordance with the widest scope consistent with the principles and novel features disclosed herein.

The invention claimed is:

1. An inverter comprising: an electronic device, a magnetic element, a heat radiator, a cooling fan, a first enclosure and a second enclosure connected with the first enclosure via a mounting plate, wherein
   the mounting plate is located between the first enclosure and the second enclosure;
   the electronic device is disposed inside the first enclosure;
   the heat radiator and the cooling fan are disposed inside the second enclosure;
   the magnetic element is disposed outside the first enclosure and the second enclosure;
   the magnetic element is disposed on a top plate of the second enclosure;
   the cooling fan is disposed on a side plate of the second enclosure inside the second enclosure, the side plate being perpendicular to gaps between fins of the heat radiator; and
   the side plate is perpendicular the top plate.

2. The inverter according to claim 1, wherein the first enclosure and the second enclosure share one mounting plate, and are located on two parallel mounting surfaces of the mounting plate respectively.

3. The inverter according to claim 1, wherein the heat radiator is disposed on the mounting plate inside the second enclosure; and the electronic device is disposed on the mounting plate inside the first enclosure.

4. The inverter according to claim 1, wherein one or more vents are disposed in another side plate of the second enclosure, the another side plate being perpendicular to the gaps between the fins of the heat radiator.

5. The inverter according to claim 4, wherein the number of the vents is more than one, and the vents are uniformly disposed at positions corresponding to the gaps between the fins of the heat radiator.

6. The inverter according to claim 1, wherein the number of the cooling fans is four.

* * * * *